United States Patent
Strong

[19]

[11] Patent Number: 5,813,342
[45] Date of Patent: Sep. 29, 1998

[54] METHOD AND ASSEMBLY FOR PRODUCING PRINTING PLATES

[75] Inventor: Kenneth M. Strong, Hockessin, Del.

[73] Assignee: MacDermid Imaging Technology, Incorporated, Waterbury, Conn.

[21] Appl. No.: 829,321

[22] Filed: Mar. 27, 1997

[51] Int. Cl.[6] .............................. G03F 7/26; G03B 27/04
[52] U.S. Cl. ..................... 101/401.1; 430/306; 355/99
[58] Field of Search .................. 101/395, 401.1, 101/467; 355/85, 113, 99; 430/300, 306, 325, 327, 328

[56] References Cited

U.S. PATENT DOCUMENTS

| | | | |
|---|---|---|---|
| 3,597,080 | 8/1971 | Gush et al. | 355/85 |
| 3,619,601 | 11/1971 | Gush et al. | 430/306 |
| 4,383,759 | 5/1983 | Bloothoofd et al. | 355/85 |
| 4,600,667 | 7/1986 | Uchida | 430/306 |
| 4,618,550 | 10/1986 | Uchida | 430/11 |
| 4,927,723 | 5/1990 | Cusdin | 430/306 |
| 5,213,949 | 5/1993 | Kojima et al. | 430/306 |
| 5,275,919 | 1/1994 | Kawatsuji et al. | 101/401.1 |
| 5,699,739 | 12/1997 | Strong | 101/463.1 |

*Primary Examiner*—Stephen R. Funk
*Attorney, Agent, or Firm*—William A. Simons; Wiggin & Dana

[57] ABSTRACT

Printing plates are formed from a layer of photo polymerizable resin by a process and assembly which includes a back masking negative placed over the non-printing side of the resin layer. A connective substrate is positioned between the back mask negative and the resin layer. A negative of the image or images to be formed on the printing plate is positioned on the side of the resin layer which is to form the printing surface of the plate. Both sides of the resin layer are exposed to UV light, and the back mask negative serves to allow hardening of the resin only in the areas of the resin layer where printing surfaces are located. Thus, a plurality of isolated printing surfaces may be formed on the plate, which printing surfaces are connected together by the connective substrate. In this manner, a photo polymerized floor need not be produced on the printing plates, allowing increased resin recovery after the plate has been formed.

5 Claims, 3 Drawing Sheets

METHOD AND ASSEMBLY FOR PRODUCING PRINTING PLATES

BACKGROUND OF THE INVENTION

1. Field of the Invention

This invention relates to the production of printing plates from photopolymerizable resins. More particularly, this invention relates to the production of printing plates with isolated printing surfaces thereon which are connected together by a connective substrate which is not formed from the polymerizable resin.

2. Brief Description of Art

Printing plates have been produced in the prior art by selectively cross-linking polymerizable resins such as F025, which is a (meth)acrylated polyurethane. The plates are formed by placing a layer of the polymerizable resin on a glass plate and placing a negative of the printing surface to be produced on the side of the glass plate opposite to the resin. Actinic light such as UV light is directed against the resin layer through the negative. The result is that the resin is selectively cross-linked and hardens to form a printing image surface which mirrors the image on the negative. Lighter areas on the negative will be more completely cross-linked than darker areas on the negative. After the process is completed, non-cross-linked liquid resin can be recovered from the printing plates. Resin recovery is an important factor relating to the production of the photo polymerized resin printing plates since the resins which are used to produce the plates are relatively expensive. It is conventional when producing such printing plates to employ an actinic light source which is directed against the side of the resin layer opposite to the printing surface. The back side light source is used to create a cross-linked polymerized "floor" in the printing plate which floor serves to interconnect the raised printing parts of the plate. This technique for producing photo cross-linked polymer printing plates is acceptable in most cases, but it is, to a certain degree, wasteful of resin in cases where the printing plates have isolated printing areas, or relatively extensive non-printing areas. In such cases, the polymerized floor of the plate can form a substantial percentage of the plate. It would be desirable to be able to form polymerized resin printing plates which do not include an extensive polymerized floor on the plates.

BRIEF SUMMARY OF THE PRESENT INVENTION

This invention relates to a method and apparatus for producing cross-linked polymer resin plates which does not require the inclusion of an extensive polymerized floor in the plate. Printing plates produced in accordance with this invention are formed in a fixture which includes a lower assembly having a lower UV light bank, and a lower glass support member which is disposed above the lower light bank. The printing surface-defining negative is disposed on the lower glass support member. The resin layer is cast onto the printing surface-defining negative. A connective substrate sheet is disposed on the upper surface of the resin layer.

The fixture also includes an upper assembly having an upper UV light bank; a back masking box disposed below the upper UV light bank; an upper glass plate mounted in the back masking box; and the back masking negative which is mounted on the upper glass plate. The upper assembly can be raised and lowered relative to the lower assembly. When the printing plate is formed, the lower assembly is loaded with the resin layer, and the upper assembly is lowered to the point where the upper glass plate rests on the connective substrate sheet. The light banks are activated so as to form the cross-linked printing areas on the plate with the lower light bank through the lower negative; and to form restricted cross-linked resin floors on the plate for each of the printing areas with the upper light bank through the upper (or back mask) negative. The restricted cross-linked floor portions of each printing area will adhere to the connective substrate sheet so that the finished printing plate will consist of a plurality of printing areas, each with a restricted cross-linked floor, and all of which are connected together by the connective substrate. By eliminating the pervasive cross-linked resin floor of the prior art, additional non-cross-linked resin can be recovered after the plate is formed. In order for the procedure to work properly, the upper negative and the lower negative must be held in proper registry with each other.

It is therefore an object of this invention to provide a method and apparatus for producing cross-linked polymer printing plates which allow for increased recovery of non-cross-linked liquid resin from the formed printing plates.

It is a further object of this invention to provide a method and apparatus of the character described which can operate with selective exposure of cross-linking light banks in the apparatus.

These and other objects and advantages of the invention will become more readily apparent from the following detailed description of an embodiment thereof when taken in conjunction with the accompanying drawings in which:

DETAILED DESCRIPTION OF THE PREFERRED EMBODIMENTS

Figure 1:
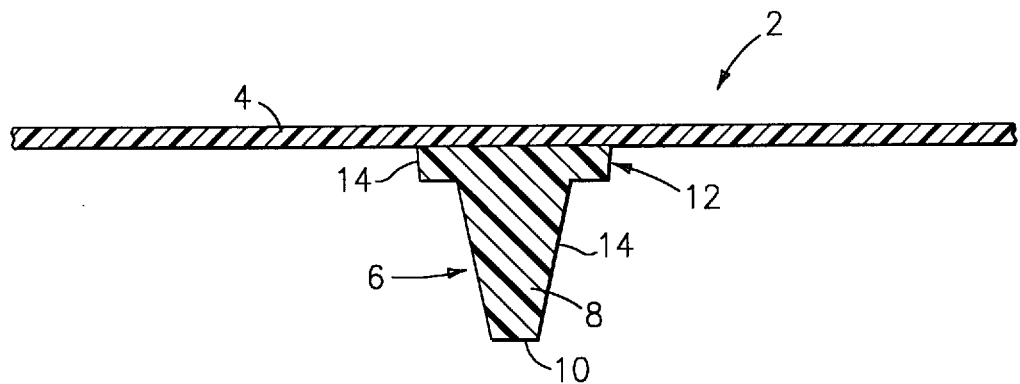
FIG. 1 is a fragmented cross-sectional view of a printing plate formed in accordance with this invention.

Referring now to the drawings, there is shown in FIG. 1 a fragment of a typical printing plate formed in accordance with this invention. The plate is denoted generally by the numeral 2 and includes a plastic connective substrate 4 which is preferably formed from a polyester resin film. Discrete printing portions 6 are connected to the substrate 4. The printing portion 6 is shown schematically in FIG. 1, and is formed from photo polymerized cross-linked (meth) acrylated polyurethane resin, such as F025; F240; F035; G125; F140; and LP025. Each printing portion 6 includes a projection 8, a printing surface 10, and a restricted floor 12 that is directly attached to the connective substrate 4. It is understood that the printing plate 2 will include a plurality of separate printing portions 6 which collectively form the image or images to be printed with the plate 2. All of the separate printing portions 6 include the components 10 and 12, and are secured to the substrate 4. Each of the printing portions 6 will also include "engineered" shoulders 14 which result in high quality printing. The shape of the shoulders 14 in the printing portion 6 is very important, and the ability to control both the top and bottom lights allows one to customize the shape of the shoulders 14. Additionally, the light speed of the particular resins used to form the printing plates will affect the shape of the shoulders 14.

Figure 2:
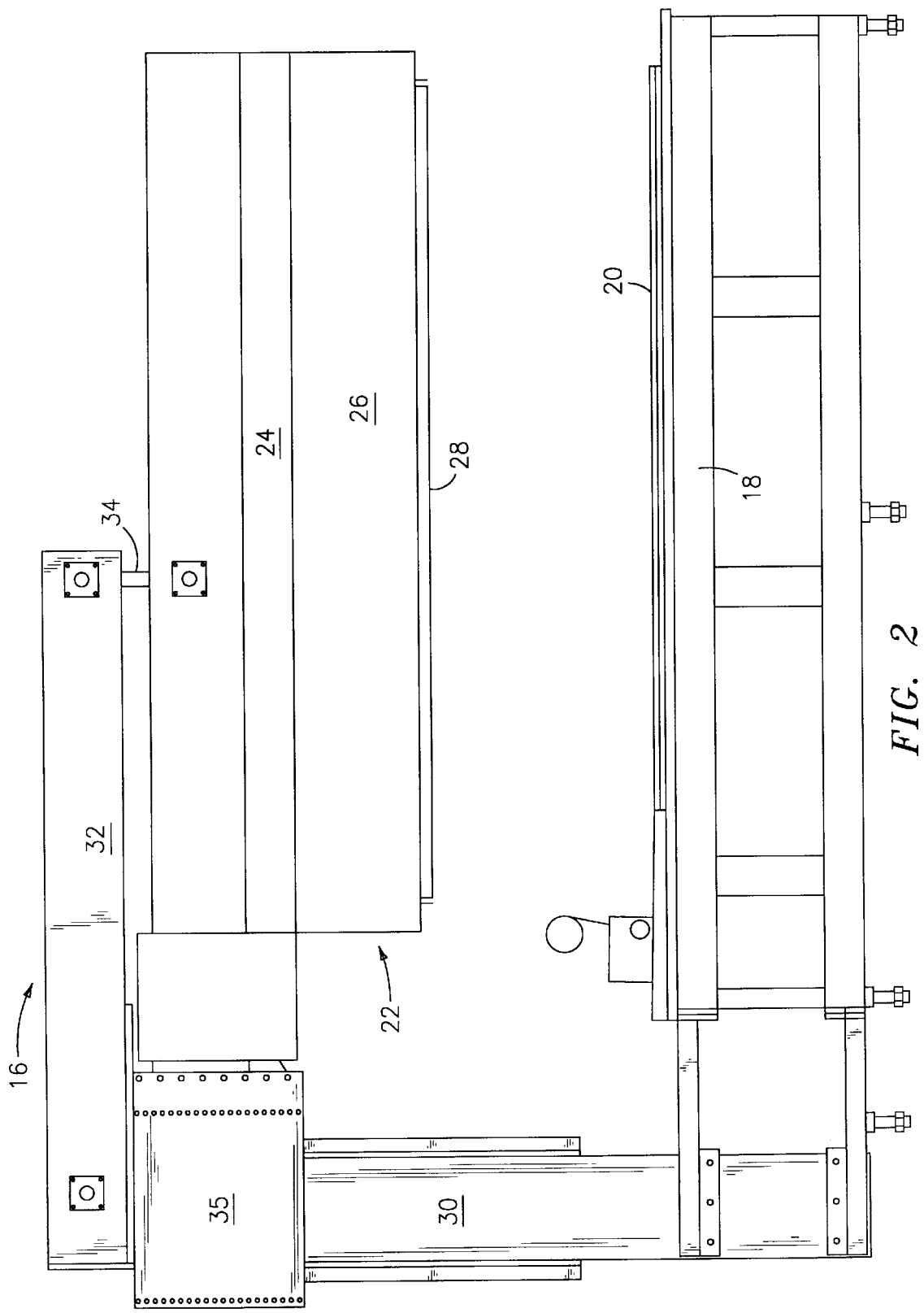
FIG. 2 is a side elevational view of a machine or fixture used for forming the printing plate of FIG. 1.

As previously noted, the printing portions 6 on the printing plate 2 are formed by photo polymerization to an appropriate resin by selectively exposing a layer of liquid resin to an actinic light source through negatives of the image to be printed. The process and assembly of this invention utilizes a front printing, printing portion negative, and a back mask floor-defining negative between which the resin layer is sandwiched. FIG. 2 shows a photopolymer exposure assembly or fixture denoted generally by the numeral 16. The fixture 16 includes a lower light bank table 18 inside of which a lower UV light source is located. A lower glass plate 20 is disposed on the table 18 above the lower UV light source. An upper fixture assembly 22 is disposed above the lower light bank table 18. The upper fixture assembly 22 includes an upper shutter box 24 in which an upper UV light source is disposed. A masking box 26 is disposed below the shutter box 24. The masking box 26 supports an upper glass plate 28 on which the back mask negative is disposed. As noted above, the back mask negative is used for forming the restricted floor portions 12 on the printing portions 6 of the plate 2. The manner in which the back mask negative operates will be set forth in greater detail hereinafter. The fixture 16 includes a guide post 30 which supports the upper fixture assembly 22 and guides movement thereof toward and away from the lower light bank table 18 by means of an hydraulic jack and safety counter weight assembly 35. A crane 32 is connected to the upper fixture assembly 22 by means of a hanger pin 34.

Figure 5:
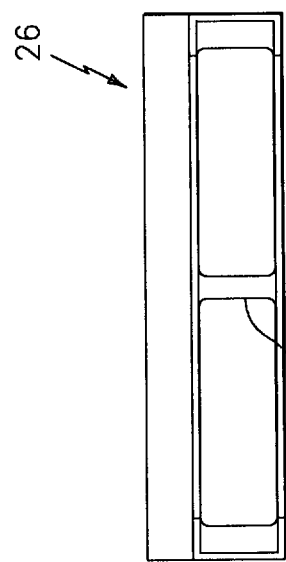
FIGS. 3–5 are plan side and end views respectively of the masking box portion of the fixture of FIG. 2.
Figure 3:
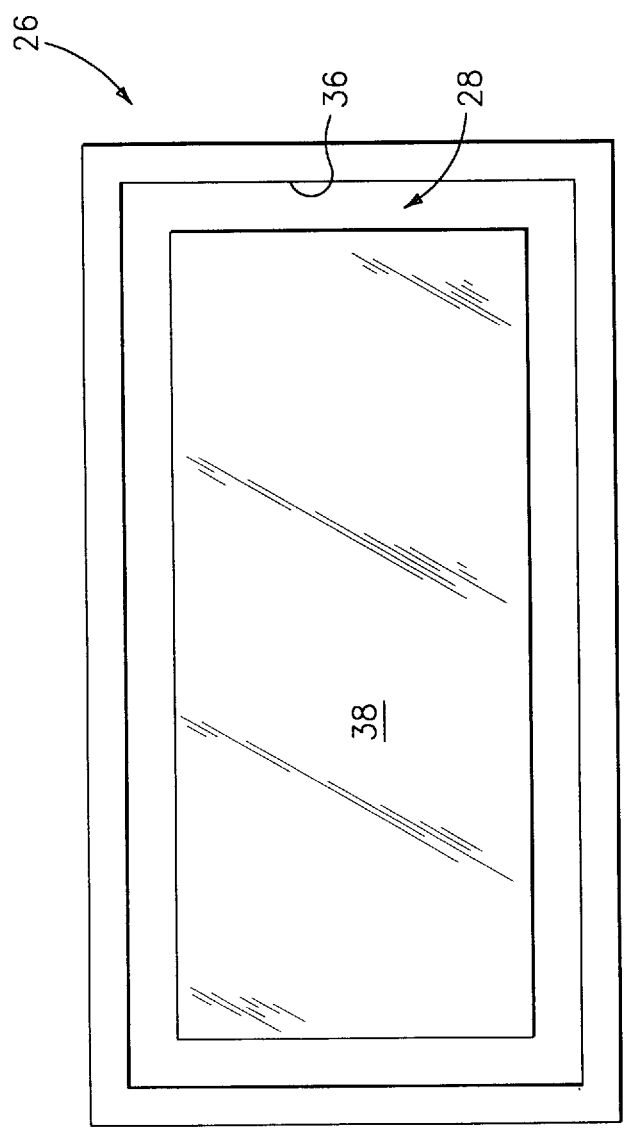
Figure 4:
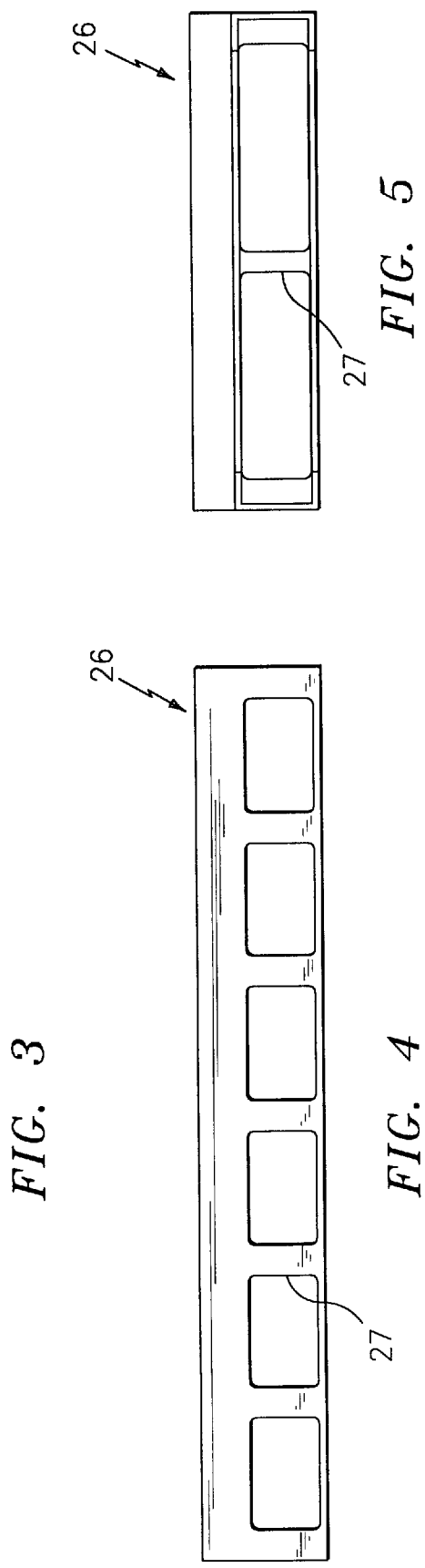

Referring to FIGS. 3–5, there is shown details of the masking box 26. The masking box 26 has a recess 36 in which the upper glass plate 28 is positioned. The back masking negative 38 is positioned on the upper surface of the upper glass plate 28. The negative 38 is inserted into the masking box recess 36 by rolling the negative into a tube, and inserting the negative tube into the box recess 36 through openings 27 in the side and end walls of the masking box 26. Once the negative tube is inserted into the box recess 36, it will reassume its flat configuration. Proper positioning of the negative in the masking box recess 36 is enabled by having the openings 27 all around the sides of the box 26 so that the operator can have access to all edges of the negative 38.

Figure 6:
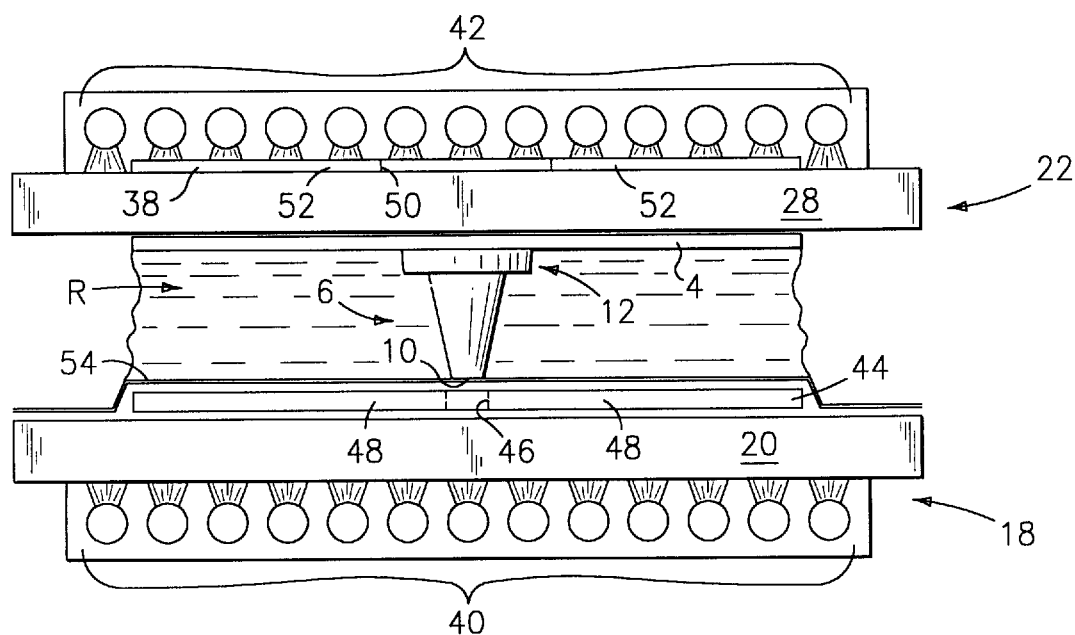
FIG. 6 is a schematic cross-sectional view of the fixture of FIG. 2 showing how the printing plate of FIG. 1 is formed.

Referring now to FIG. 6, the location of the lower and upper components 18 and 22 respectively of the fixture 16 are shown during the formation of a printing plate in accordance with this invention. It will be noted that there is a bank of UV lights 40 and 42 associated with the lower and upper plates respectively. A lower negative 44 is positioned on the lower glass plate 20 and the upper negative 38 is positioned on the upper glass plate 28. The lower negative 44 defines the printing portions 6 on the printing plate and the upper negative 38 defines the floor portions 12 on the printing plate. For example, an area 46 in the lower negative 44 will be transparent so that light from the lower light bank 40 will be transmitted therethrough, while surrounding areas 44 will be opaque. The shape of area 46 will define the shape of the printing surface 10 on the resultant printing plate. A corresponding transparent area 50 surrounded by opaque areas 52 is disposed in the upper negative 38. The upper negative area 50 has the same configuration as the lower negative area 46, but is larger than the lower negative area 46. The upper negative area 50 thus defines the shape and size of the cross-linked floor 12 on the printing portion of the plate.

In order to produce a printing plate, the lower negative 48 is positioned on the lower glass plate 20 and is overlain by a cover film 54 of polypropylene. A layer of liquid photo cross-linkable resin R is then cast onto the film 54 and the connective substrate 4 is placed in the top of the resin layer R. The upper glass plate 28 with the upper negative 38 is then lowered to the position shown in FIG. 6. The light banks 40 and 42 are then turned on so that the desired cross-linked printing portions 6 are produced in the liquid resin layer R. The areas of liquid resin which are shielded by opaque portions 48 and 52 of the negatives 48 and 38 will not cross-link and will remain in the liquid state. The result of using the upper or back negative 38 is the production of printing portions 6, each having its own restricted cross-linked floor. This feature allows more of the resin to remain in the liquid state so that more of the resin can be recovered from the plate after the latter has been formed. After the printing portions of the plate have been formed, the liquid non-cross-linked resin is removed and recovered from the plate. If an upper negative were not used, the finished plate would have a pervasive cross-linked polymer floor interconnecting all of the printing portions of the plate. By eliminating the pervasive floor, more of the resin can be recovered for further use, thus increasing the economics of plate manufacture.

By following the teachings of this invention, printing plates can be formed from photo polymerizable resins which plates will be more economical to produce, and will result in an increase in recovery of the non-polymerized resin fraction from the formed plate. Recovery of an increased amount of the liquid resin fraction from the formed plates enables one to produce more printing plates from any given amount of resin. Additionally, the use of upper and lower negatives allows one to form customized printing portions on the plate.

Since many changes and variations of the disclosed embodiment of the invention may be made without departing from the inventive concept, it is not intended to limit the invention otherwise than as required by the appended claims.

What is claimed is:

1. A system for producing cross-linked photopolymerized printing plates, said system comprising:

A) first and second opposed banks of UV lights for selectively cross-linking a layer of a photopolymerizable resin;

B) first and second support plates between said first and second banks of lights for confining the layer of resin during production of a printing plate;

C) a first negative interposed between the layer of resin and said first bank, said first negative including transparent portions and opaque portions, said transparent portions being operable to define cross-linked resin printing surfaces on the plate being formed and said opaque portions being operable to define areas on the plate wherein the resin will not be cross-linked; and D) a second negative interposed between said second support plate and said second light bank, said second negative including transparent portions and opaque portions, said transparent portions on said second negative being aligned with said transparent portions on said first negative so as to define individual cross-linked resin floors on the plate which are shaped like the printing surfaces but are larger than the printing surfaces, and said opaque portions on said second negative being operable to define areas on the plate wherein the resin will not be cross-linked.

2. The system of claim 1 wherein said first negative is positioned between said first support plate and said layer of resin, the system further comprising a cover sheet adjacent to said first negative so as to prevent the resin from directly contacting said first negative.

3. The system of claim 1 further comprising a connective sheet interposed between said second negative and the resin layer, said connective sheet forming a component of the finished printing plate which component interconnects separate cross-linked resin printing surface floors on the plate.

4. The system of claim 1 further comprising a masking box for supporting said second negative, said masking box being operative to properly position said second negative relative to said first negative.

5. The system of claim 4 wherein said masking box includes lateral openings through which the first negative can be inserted into said masking box.

\* \* \* \* \*